(12) United States Patent
Cordaro

(10) Patent No.: US 6,689,950 B2
(45) Date of Patent: Feb. 10, 2004

(54) PAINT SOLAR CELL AND ITS FABRICATION

(75) Inventor: James F. Cordaro, Ridgecrest, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/844,405

(22) Filed: Apr. 27, 2001

(65) Prior Publication Data

US 2002/0157702 A1 Oct. 31, 2002

(51) Int. Cl.$^7$ ............... H01L 31/04; H01L 31/0256
(52) U.S. Cl. ............... 136/250; 136/254; 438/57; 438/63; 438/90
(58) Field of Search ............... 136/254, 256, 136/260–263, 265, 250; 106/635, 627, 400, 419, 425, 452, 456, 481; 438/57, 63, 90

(56) References Cited

U.S. PATENT DOCUMENTS

| | | | |
|---|---|---|---|
| 4,175,982 A | * 11/1979 | Loutfy et al. | 136/255 |
| 4,365,106 A | * 12/1982 | Pulvari | 136/206 |
| 4,381,233 A | * 4/1983 | Adachi et al. | 204/242 |
| 4,749,631 A | * 6/1988 | Haluska et al. | 428/704 |
| 4,923,524 A | * 5/1990 | Kiss | 136/250 |
| 4,947,219 A | * 8/1990 | Boehm | 257/471 |
| 5,094,693 A | 3/1992 | Cordaro et al. | 106/425 |
| 5,112,408 A | * 5/1992 | Melchior | 136/251 |
| 5,151,385 A | * 9/1992 | Yamamoto et al. | 438/96 |
| 5,807,909 A | 9/1998 | Cordaro et al. | 523/179 |
| 5,820,669 A | 10/1998 | Cordaro | 106/635 |
| 5,866,471 A | * 2/1999 | Beppu et al. | 438/502 |
| 6,027,075 A | 2/2000 | Petrenko | 244/134 R |
| 6,099,637 A | 8/2000 | Cordaro | 106/635 |
| 6,124,378 A | 9/2000 | Cordaro et al. | 523/179 |

OTHER PUBLICATIONS

Uda et al. "All Screen Printed CdS/CdTe Solar Cells" $16^{th}$ IEEE Photovoltaic Specialists Conference—1982. pp. 801–804.*

Tomar et al. "Photovoltaic Characteristics of CdS/CdTe Screen Printed Heterojunction" $17^{th}$ IEEE Photovoltaic Specialists Conference—1984. pp. 1400–1403.*

Egusa et al., "Piezoelectric paints as one approach to smart structural materials with health–monitoring capabilities," *Smart Materials*, vol. 7 (1998), pp. 438–445.

* cited by examiner

Primary Examiner—Nam Nguyen
Assistant Examiner—Brian L Mutschler

(57) ABSTRACT

A solar cell has an active structure including a paint voltage source having a first paint layer structure comprising p-type pigment particles dispersed in a first-layer binder, and a second paint layer structure comprising n-type pigment particles dispersed in a second-layer binder. The second paint layer structure is in electrical contact with the first paint layer structure. The active structure further includes an electrically conductive contact structure having a first electrically conductive contact to the first paint layer structure, and a second electrically conductive contact to the second paint layer structure. At least one of the first electrically conductive contact and the second electrically conductive contact permits light to pass therethrough to the paint voltage source. A capacitive paint layer may be included to store electrical charge produced by the active structure. The active structure may be affixed to a support.

26 Claims, 5 Drawing Sheets

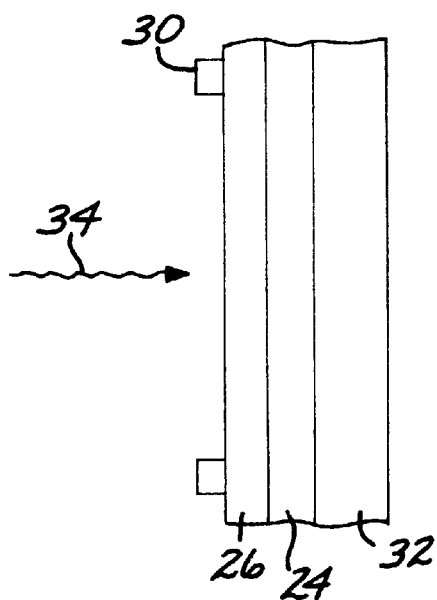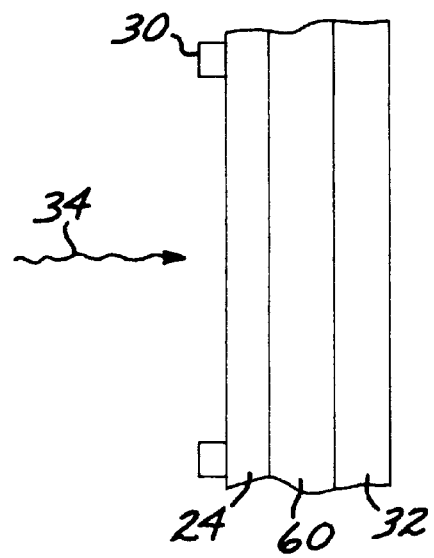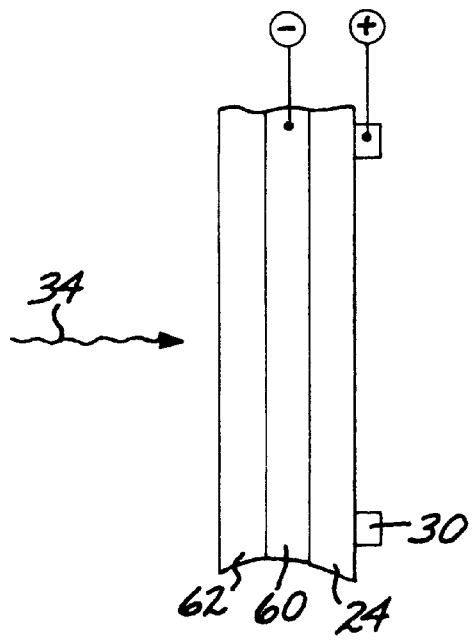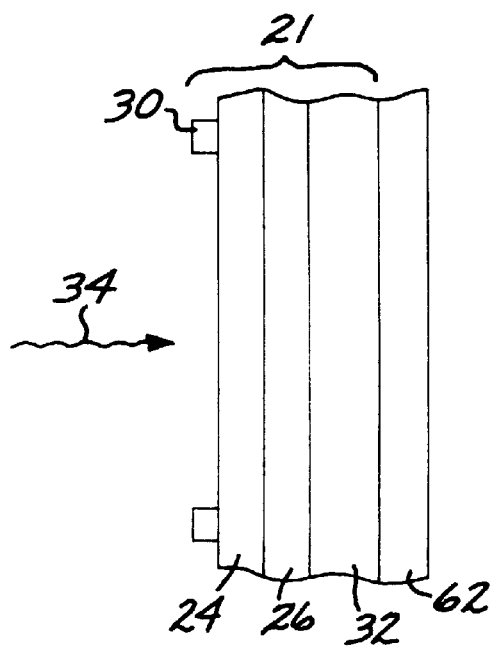

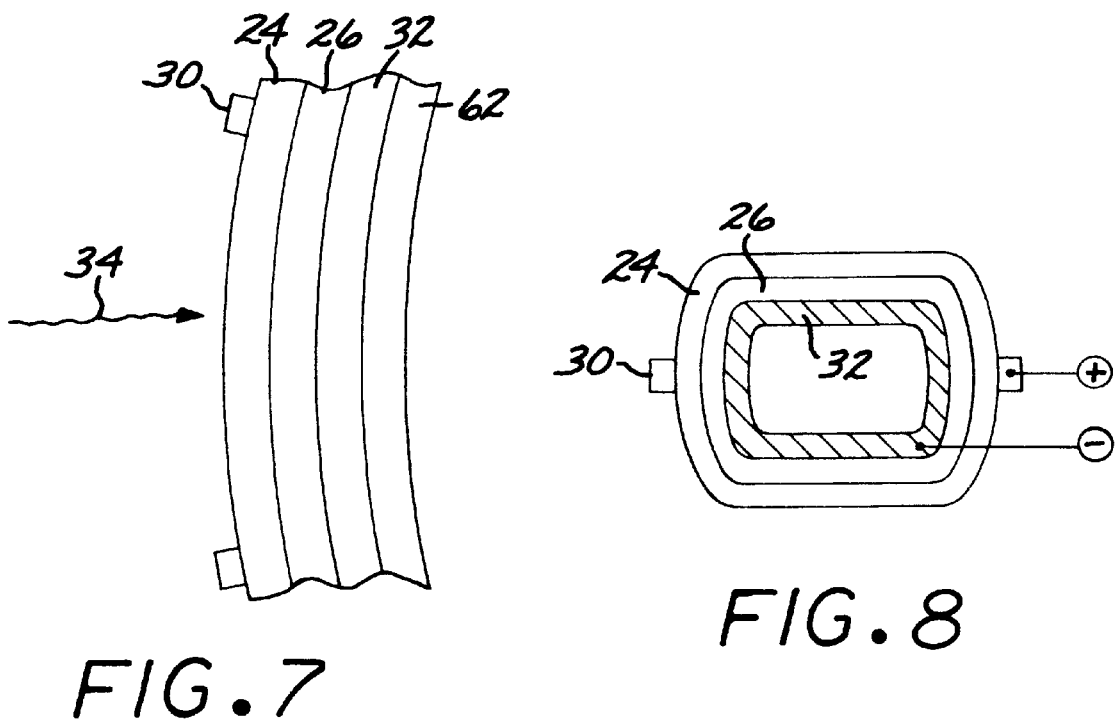
FIG. 7
FIG. 8
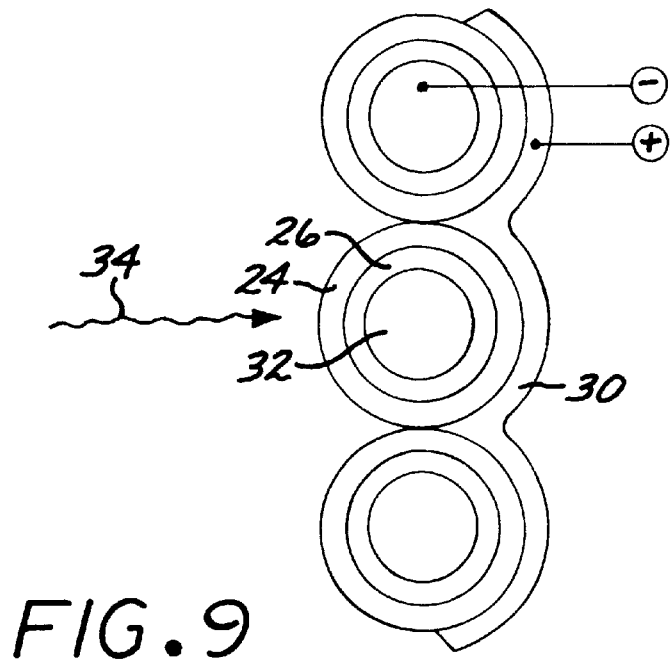
FIG. 9

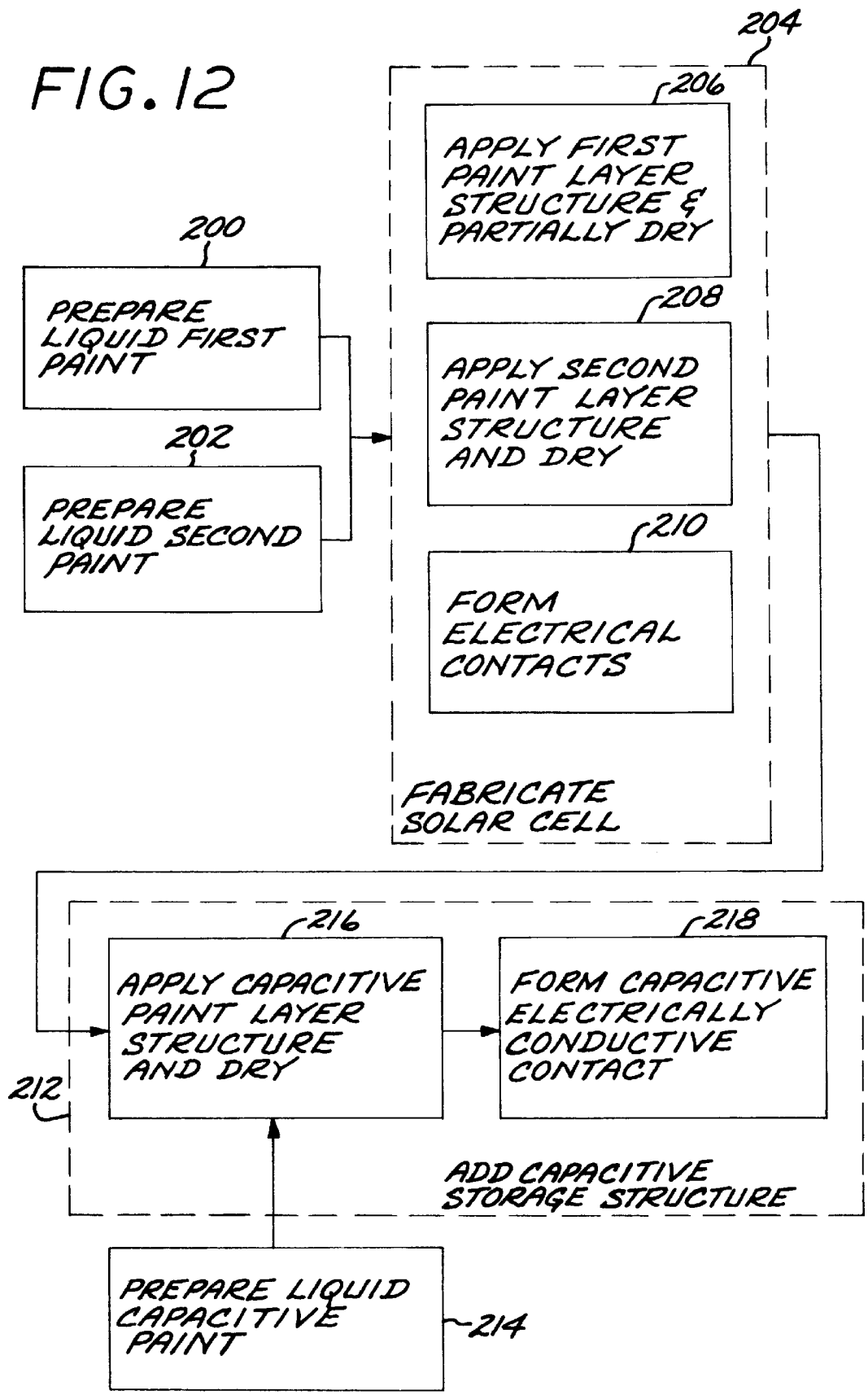

PAINT SOLAR CELL AND ITS FABRICATION

This invention relates to a solar cell and, more particularly, to a solar cell wherein the voltage is produced by paint layers that are applied by painting techniques.

BACKGROUND OF THE INVENTION

A solar cell is a device which directly converts the energy of the sun into electrical energy by a photovoltaic process. The solar cell, also sometimes termed herein a photovoltaic cell, generates an electrical voltage and current based on the interaction of the incident solar energy with semiconductor materials in the solar cell. Solar cells are the primary energy source for many types of spacecraft such as communications satellites. Additionally, they are used in terrestrial locations such as remote sites that are not readily accessible to conventional electrical service.

The solar cell is based on a PN junction between layers of p-type semiconductor material and n-type semiconductor material. These semiconductor materials are typically a base semiconductor material doped to be p-type or n-type, as required. Various base semiconductor materials are used, with examples being silicon and gallium arsenide.

The solar cell is prepared by depositing or otherwise forming a layer of the n-type semiconductor overlying a layer of the p-type semiconductor. Appropriate electrical contacts to the layers are provided to collect the voltage and current that result when light is incident upon the layered structure, with one of the electrical contacts permitting the passage of light therethrough to the semiconductor layers.

Solar cells are expensive to fabricate and are fragile. The expense arises in part because solar cells are inherently relatively inefficient in converting solar energy to electricity, and it is therefore necessary to provide a large area of the solar cell to achieve large voltages and/or currents. The fabrication of layered semiconductor structures of a large size by conventional semiconductor deposition techniques is difficult and expensive, because the techniques are complex. The active components of the solar cell are mounted to a support such as a frame that orients the semiconductor materials toward the light source and also protects the components from physical damage. The semiconductor layers are fragile and easily broken during fabrication, assembly, transportation (such as spacecraft launch), and service (such as impact by micrometeorites).

Existing solar cells are highly useful but have practical shortcomings. There is a need for an improved solar cell that is less expensive to produce and more robust than available solar cells. The present invention fulfills this need, and further provides related advantages.

SUMMARY OF THE INVENTION

The present invention provides a solar (photovoltaic) cell and a method for its fabrication. The voltage-generating components of the solar cell are paints, which may be formulated and then applied using painting techniques rather than the complex semiconductor deposition techniques. The preparation of solar cells of arbitrarily large size is therefore straightforward and inexpensive, and the amount of frame-like support structure is minimal. The finished solar cells are mechanically robust and resistant to breakage, inasmuch as they are not brittle and a crack or fracture does not rapidly propagate through the solar cells as in the case of conventional solar cells. That is, the solar cells are robust against damage from vibration, impacts, and the like. The solar cells may be fabricated on a flexible support and stowed for transport, on a flat support, or on a curved support. These features are important advantages for solar cells to be used in space, for which launch costs on a weight or volume basis are high.

The solar cell itself may be tuned to the required wavelengths for optimal efficiency without resorting to multiple discrete layers of semiconductor material as in the case of conventional solar cell designs. A capacitive energy-storage paint layer may be added to store excess electrical charge for later use, reducing the battery storage requirements. The solar cell also aids in thermal control and dissipation of electrostatic charges that build up on the surface of the spacecraft over time.

While the primary focus of the present application is on the preferred use of the solar cell for spacecraft, it is also suitable for terrestrial power production. The solar cell may be applied to large areas of conventional structures. The paint solar cell may be applied, for example, to a roof or exterior wall both to protect structures and to generate electrical power.

In accordance with the invention, a solar cell comprises an active structure including a paint voltage source having a first paint layer structure comprising p-type pigment particles dispersed in a first-layer binder, and a second paint layer structure comprising n-type pigment particles dispersed in a second-layer binder, the second paint layer structure being in electrical contact with the first paint layer structure. The binders may be organic or inorganic. Filler particles may be present in either layer. The layers are preferably applied on top of each other in direct physical contact. The p-doped first paint layer structure may face the sun with the n-doped second paint layer structure thereunder, a "p over n" configuration. Alternatively, the n-doped second paint layer structure may face the sun with the p-doped first paint layer structure thereunder, an "n over p" configuration. Preferably, at least one of the layers, most preferably the layer facing the sun, is black in color to absorb the solar energy.

The solar cell further has an electrically conductive contact structure having a first electrically conductive contact to the first paint layer structure, and a second electrically conductive contact to the second paint layer structure. At least one of the first electrically conductive contact and the second electrically conductive contact permits light to pass therethrough to the paint voltage source.

The solar cell as described may be freestanding in some embodiments, or there may be a support to which the active structure is attached. The support may be of any operable type and physical configuration, such as flexible, rigid, flat, or curved.

In another embodiment, only one of the p-type layer and the n-type layer need be a paint, and the other may be a non-paint semiconductor.

Thus, a solar cell comprises an active structure including a voltage source having a p-type semiconductor layer structure and an n-type semiconductor layer structure in electrical contact with each other. At least one of the semiconductor layer structures is a paint layer structure comprising first-layer paint pigment particles dispersed in a first-layer binder. The first-layer paint pigment particles are selected from the group consisting of p-type pigment particles and n-type pigment particles. An electrically conductive contact structure has a first electrically conductive contact to a first one of the semiconductor layer structures, and a second electrically conductive contact to a second one of the semiconductor layer structures. At least one of the first electrically conductive contact and the second electrically conductive contact permits light to pass therethrough to the voltage source.

Spacecraft and other installations that generate electrical energy from solar cells experience periods of darkness during service. It is therefore necessary to store some of the generated electrical energy during periods of light in batteries or other energy storage devices for later use. The present approach provides a capacitive paint layer that may be used in conjunction with the paint solar cell. The capacitive paint layer stores electrical energy generated by the solar cell and may be later discharged through the load when the electrical energy is needed. The capacitive paint layer allows the heavy, expensive batteries to be reduced in number and size or eliminated completely from the electrical system.

The solar cell may therefore include a capacitor in electrical communication with, and typically painted upon, the electrically conductive contact that does not permit light to pass therethrough. The capacitive paint layer structure preferably comprises pyroelectric/ferroelectric pigment particles dispersed in a capacitive layer binder. A first side of the capacitive paint layer structure contacts the non-light-transmitting electrically conductive contact remote from the paint voltage source. A capacitor electrically conductive contact is in electrical communication with a second side of the capacitive paint layer structure remote from the first side, producing a capacitor between the electrically conductive contact of the paint voltage source and the capacitor electrically conductive contact.

A method for preparing a solar cell comprises the steps of preparing a liquid first paint comprising p-type pigment particles, a first-paint binder, and a first paint liquid vehicle, and preparing a liquid second paint comprising n-type pigment particles, a second-paint binder, and a second paint liquid vehicle. The solar cell is fabricated by applying a first layer of the liquid first paint and at least partially drying the liquid first paint by removing the first paint liquid vehicle, to leave a solid first paint layer structure comprising the p-type pigment particles and the first-paint binder, and applying a second layer of the liquid second paint and drying the liquid second paint by removing the second paint liquid vehicle, to leave a solid second paint layer structure comprising the n-type pigment particles and the second-paint binder. A first electrically conductive contact is formed to the solid first paint layer structure, and a second electrically conductive contact is formed to the solid second paint layer structure. At least one of the first electrically conductive contact and the second electrically conductive contact permits light to pass therethrough.

The present invention provides a major advance in the art of solar cells and photovoltaic generation of electrical power. Solar electrical power may be generated by a solar cell that is applied by painting. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 3–9 are schematic view of additional embodiments of the solar cell made according to the invention;

FIG. 12 is a block flow diagram of an approach for preparing a paint solar cell.

DETAILED DESCRIPTION OF THE INVENTION

Figure 1:
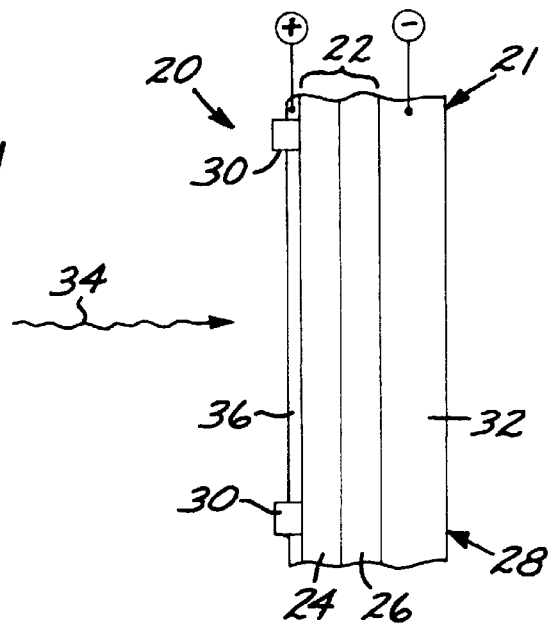
FIG. 1 is a schematic view of a first embodiment of a solar cell made according to the invention.

FIG. 1 depicts a paint solar cell 20 utilizing the approach of the invention. The paint solar cell 20 comprises an active structure 21 illustrated in FIG. 1, and may also include a passive support that will be discussed subsequently. The active structure includes a paint voltage source 22 having a first paint layer structure 24 comprising p-type pigment particles dispersed in a first-layer binder, and a second paint layer structure 26 comprising n-type pigment particles dispersed in a second-layer binder. (As used herein, reference to "p-type" indicates a p-type semiconductor material, and reference to "n-type" indicates an n-type semiconductor material.) The second paint layer structure 26 is in electrical contact with the first paint layer structure 24. The electrical contact is preferably achieved by applying the two paint layer structures 24 and 26 one over the other in the manner of two coats of paint applied one over the other. The two paint layer structures 24 and 26 are therefore in direct physical contact with each other.

The paint solar cell 20 further includes an electrically conductive contact structure 28 having a first electrically conductive contact 30 to the first paint layer structure 24, and a second electrically conductive contact 32 to the second paint layer structure 26. At least one of the first electrically conductive contact 30 and the second electrically conductive contact 32 permits light to pass therethrough to the paint voltage source 22. In the embodiment of FIG. 1, the first electrical contact 30 is a grid, ring, or other arrangement of electrical conductors having open spaces therethrough that permit incident light 34 such as sunlight to pass through to the paint layer structures 24 and 26. (The incident light 34 may be direct from its source or may be collected and intensified by an optical system that is not shown.) In the embodiment of FIG. 1, the second electrical contact 32 is a solid sheet of an electrical conductor such as aluminum. If it is sufficiently thick, the second electrical contact 32 may serve as a support for the remaining elements of the paint solar cell 20.

A protective coating 36 may optionally overlie the first paint layer structure 24 on the outwardly (sun) facing side. The protective coating 36 is transparent to the light sensed by the paint solar cell 20, but protects the underlying paint layer structures 24 and 26 from weathering and damage such as scratching. The protective coating 36 is preferably a layer of the same material that forms the first-layer binder of the first paint layer structure 24, either with or without a filler. The protective coating 36 is shown in FIG. 1 but omitted from the other drawings of embodiments of the paint solar cell 20, with the understanding that it may be present in each of these other embodiments.

The paint layer structures 24 and 26 are "paints". A paint is defined as a mixture comprising solid pigment particles, and optionally other particles such as filler particles, dispersed throughout a binder. Additives to aid in flow modification and impart other properties to the paint may also be present. The paint is initially in a flowable form with the solid particles in the flowable binder and usually with a flowable paint vehicle (such as a solvent for the binder) present to increase the flowability of the paint and thereby aid in the application of the flowable paint. Typical paint vehicles include water or a flowable organic material such as xylene, VM&P naphtha, methyl ethyl ketone (MEK), or methyl isobutyl ketone (MIBK). The paint is applied in this flowable form and thereafter dries to a solid form with the solid particles in a solid binder. The application of the paint and the drying are typically performed in air at room temperature, although the paint may be heated slightly to accelerate the drying and to cure the binder where the binder is a curable material. The paint vehicle is lost, typically by evaporation, in the drying process. The paints of the present invention are provided in flowable form, are applied in a manner comparable with conventional paints, and dry in the manner of paints.

However, the paints of the present invention are unlike conventional paints in their manner of functioning and in the solar cell in which they are used. The paints of the present invention are also unlike conventional solar cell materials because they are thin layers that are applied by painting techniques such as spraying, microspraying such as inkjet printing, spin coating, brushing, rolling, dipping, or drawdown, are normally applied at room temperature in air, and are normally dried at room temperature or slightly elevated temperatures in air. The mechanical properties of the paint may be altered by changing the characteristics of the binder, such as between stiff and hard paint, as compared with flexible and soft paint.

Figure 2:
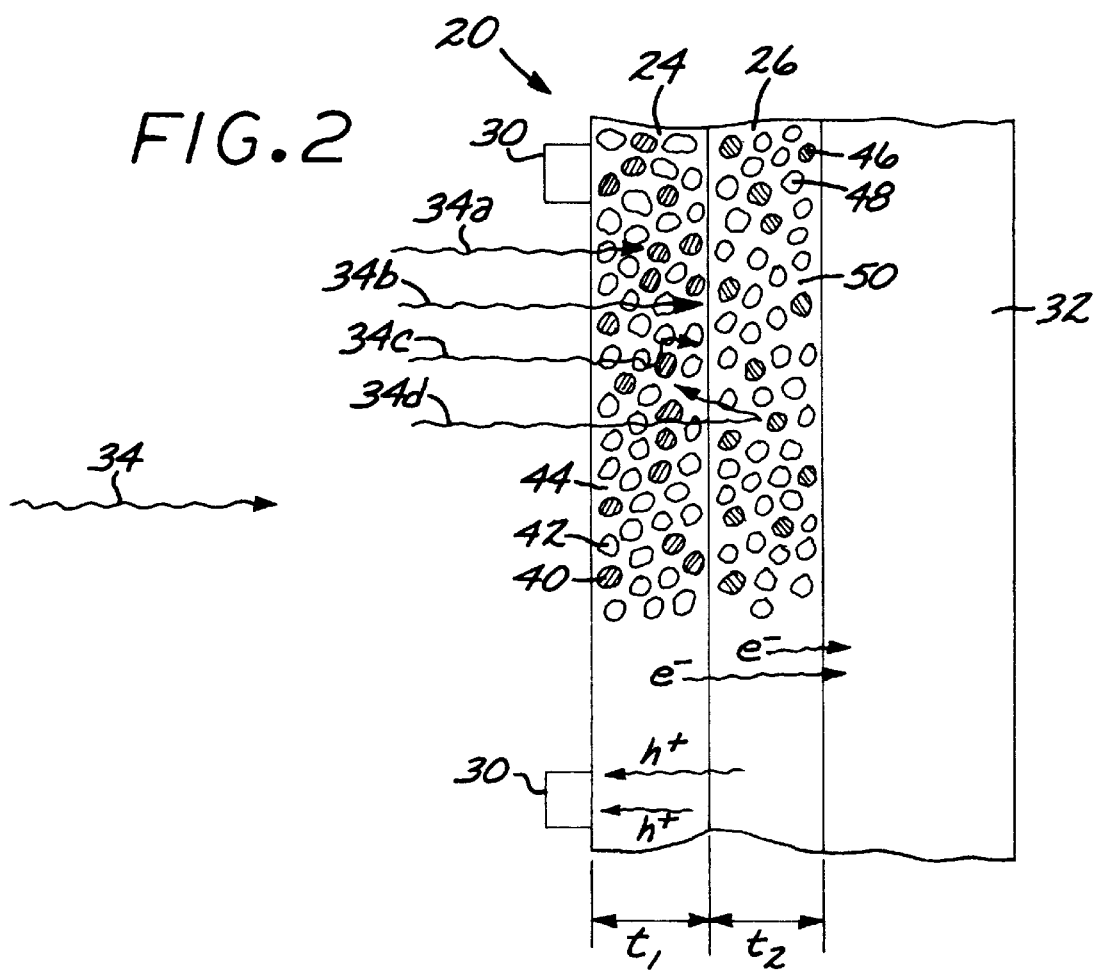
FIG. 2 is a schematic depiction of the operation of the solar cell of FIG. 1.

FIG. 2 schematically illustrates the paint solar cell 20 with the microstructure of the paint layer structures and the general mechanisms of operation illustrated.

The first paint layer structure 24 includes a plurality of p-type pigment particles 40 made of an operable p-type semiconductor material. Examples of operable p-type semiconductor materials that may be used as p-type pigment particles 40 include, but are not limited to, $Cu_2S$, p-Si, p-GaAs, and any metal-deficient oxide such as $Cu_{1-\delta}O$, where $\delta$ is slightly greater than zero, such as about 0.1 or less. Mixtures of different compositions of p-type semiconductor particles may also be used as the p-type pigment particles 40. The use of mixtures of p-type semiconductor particles 40 with different semiconducting band gaps allows the individual particles to respond to different wavelengths of the incident light 34, to maximize the conversion efficiency of solar energy to electrical energy. These mixtures of p-type semiconductor particles 40 may be provided in a single layer of the first paint layer structure 24, or in different sublayers of the first paint layer structure 24. In the preferred embodiments, the first paint layer structure 24 is desirably black in color to aid in the absorption of the incident light 34. The above-listed p-type pigment particles 40 are black in color and impart that color to the first paint layer structure 24. The p-type pigment particles 40 may be of any operable morphology and size, but typically are generally equiaxed particles from about 0.1 to about 10 micrometers in dimension. Filler particles 42 may also be present. The filler particles 42 typically are present to modify the bulk and flow consistency of the first paint layer structure 24. They may be opaque or transparent to the light wavelengths of interest. Examples of operable filler particles 42 include, but are not limited to, $SiO_2$ and $Al_2O_3$. The filler particles 42 may be of any operable morphology and size, but typically are generally equiaxed particles from about 0.1 to about 10 micrometers in dimension. The p-type pigment particles 40 and/or the filler particles 42 may be doped in the manner discussed in U.S. Pat. No. 6,099,637, to impart additional electrical conductivity to aid in electrostatic charge dissipation.

The first paint layer structure 24 further includes a binder 44. The binder 44 serves as a matrix in which the particles 40 and 42 are embedded and dispersed, and thence as a conductive medium. To this end, a conductive or partially conductive binder may optionally be used, as by blending an electrically conductive polymer such as an electrically conductive polyaniline into the binder material. The binder 44 also serves to adhere the first paint layer structure 24 to other layers or structure. The binder 44 may be an organic binder or an inorganic binder. Examples of operable organic binders include binders generally used in paints, such as latex, and polymers such as fluoroelastomers (e.g., poly [tetrafluoroethylene-co-vinylidene fluoride-co-propylene]), cross-linked and polymerized dimethyl silicone copolymer, silicone-modified epoxy, polyurethane, poly(dimethylsiloxane), poly(dimethylsiloxane-co-methylphenylsiloxane), polyimide, and polyamide. An example of an operable inorganic binder is potassium silicate.

The p-type pigment particles 40 are preferably present in an amount of from about 50 to about 80 percent by volume of the first paint layer structure 24.

The first paint layer structure 24 may be of any operable thickness $t_1$, but is typically from about 0.0005 to about 0.0015 inch thickness.

The second paint layer structure 26 includes a plurality of n-type pigment particles 46 made of an operable n-type semiconductor material. Examples of operable n-type semiconductor materials that may be used as n-type pigment particles 46 include n-ZnO, n-$In_2O_3$ (e.g., $In_2O_3$:Sn, known as indium tin oxide or ITO), n-Si, n-GaAs, n-ZnS, $Cd_2SnO_4$, and any metal-excess oxide such as $Zn_{1+\delta}O$, where $\delta$ is slightly greater than zero, such as 0.1 or less. Mixtures of different compositions of n-type semiconductor particles may also be used as the n-type pigment particles 46. The use of mixtures of n-type semiconductor particles 46 with different semiconducting band gaps allows the individual particles to respond to different wavelengths of the incident light 34, to maximize the conversion efficiency of solar energy to electrical energy. These mixtures of n-type semiconductor particles 46 may be provided in a single layer of the second paint layer structure 26, or in different sublayers of the second paint layer structure 26. In the preferred embodiments, the second paint layer structure 26 is desirably light in color to reflect any incident light 34 that reaches the second paint layer structure 26 back into the first paint layer structure 24. The above-listed n-type pigment particles 46, such as the preferred $Cd_2SnO_4$ particles, are for the most part yellow in color and impart that yellow color to the second paint layer structure 26. The n-type pigment particles are preferably light in color to reflect solar energy from the n-type layer, but the use of the preferred yellow n-type pigment particles (rather than white ZnO-based particles) is dictated by their higher electrical conductivities. The n-type pigment particles 46 may be of any operable morphology and size, but typically are generally equiaxed particles from about 0.1 to about 10 micrometers in dimension. Filler particles 48 may also be present. The filler particles 48 typically are present to modify the bulk and flow consistency of the second paint layer structure 26. They may be opaque or transparent to the light wavelengths of interest. Examples of operable filler particles 48 include, but are not limited to, $SiO_2$ and $Al_2O_3$. The filler particles 48 may be of any operable morphology and size, but typically are generally equiaxed particles from about 0.1 to about 10 micrometers in dimension. The n-type pigment particles 46 and/or the filler particles 48 may be doped in the manner discussed in U.S. Pat. No. 6,099,637, to impart additional electrical conductivity to aid in electrostatic charge dissipation.

The second paint layer structure 26 further includes a binder 50. The binder 50 serves as a matrix in which the particles 46 and 48 are embedded and dispersed, and thence as a conductive medium. To this end, a conductive or partially conductive binder may optionally be used, as by blending an electrically conductive polymer such as an electrically conductive polyaniline into the binder material. The binder 50 also serves to adhere the second paint layer structure 26 to other layers or structure. The binder 50 may be an organic binder or an inorganic binder. Examples of operable organic binders include binders generally used in paints, such as latex, and polymers such as fluoroelastomers (e.g., poly[tetrafluoroethylene-co-vinylidene fluoride-co-propylene]), cross-linked and polymerized dimethyl silicone copolymer, silicone-modified epoxy, polyurethane, poly(dimethyl-siloxane), poly(dimethylsiloxane-co-methylphenylsiloxane), polyimide, and polyamide. An example of an operable inorganic binder is potassium silicate.

The n-type pigment particles 46 are preferably present in an amount of from about 50 to about 80 percent by volume of the second paint layer structure 26.

The second paint layer structure 26 may be of any operable thickness $t_2$, but is typically from about 0.0005 to about 0.0015 inch thickness.

The protective coating 36, where present, is preferably of the same composition as the binder 44. The protective coating 36 is preferably clear and transparent to incident light 34. The protective coating 36 may also include hard filler particles such as glass microspheres that impart scratch resistance to the protective coating 36. The hard filler particles, if any, desirably have about the same index of refraction as the material of the protective coating to avoid refraction of the incident light.

The first electrically conductive contact 30 may be any operable material and geometry. In the embodiment of FIG. 1, the first electrically conductive contact 30, which faces the incident light 34, must permit light to pass therethrough. The passing of light may be accomplished either by using an opaque electrical conductor in a pattern with openings therethrough, or by using a continuous layer of a transparent electrical conductor. The preferred first electrically conductive contact 30 is colloidal silver (gold may also be used) in a fluoroelastomer resin applied to the first paint layer structure 24 as a ring, grid, or stripe pattern to establish an ohmic contact to the semiconductor pigment particles.

The second electrically conductive contact 32 may be any operable material and geometry. Because it is not on the sun-facing side, the second electrically conductive contact 32 need not permit light to pass therethrough. In the embodiment of FIG. 1, the second electrically conductive contact 32 is a solid sheet of an electrical conductor, such as aluminum, that establishes an ohmic contact to the semiconductor pigment particles. The second electrically conductive contact 32 may be quite thin, on the order of 0.001 inch in thickness, when the second electrical conductive contact 32 is not required to impart any physical strength to the paint solar cell 20. In other cases, the second electrically conductive contact 32 may be made thicker, on the order of 0.010 inch or more, to serve as the structural support for the paint solar cell 20.

In a most preferred embodiment, the p-type pigment particles 40 are $Cu_2S$ particles, and the n-type pigment particles 46 are $Cd_2SnO_4$ particles. The binder 44, the binder 50, and the protective coating 36 are poly[tetrafluoroethylene-co-vinylidene fluoride-co-propylene]. The first electrically conductive contact 30 is a grid of colloidal silver in a fluoroelastomer resin, and the second electrically conductive contact 32 is a continuous layer of aluminum.

There are a number of light absorption paths for the incident light 34, and some examples are illustrated in FIG. 2. The incident light 34 may be absorbed by the p-type pigment particles 40 in the first paint layer structure 24 near its outwardly facing surface, light path 34a. The incident light 34 may be absorbed by the p-type pigment particles 40 in the first paint layer structure 24 nearer to the interface of the layer structures 24 and 26, light path 34b. The incident light 34 may be scattered by some of the p-type pigment particles 40 and then absorbed by others of the p-type pigment particles 40 in the first paint layer structure 24, light path 34c. The incident light 34 may reach the second paint layer structure 26, be backscattered by the n-type pigment particles 46 into the first paint layer structure 24, and then absorbed by the p-type pigment particles 40 in the first paint layer structure 24, light path 34d. Typically, all of these light paths are functional at any time.

Upon the absorption of light, holes h+ migrate to the positive terminal of the paint solar cell 20, which in this case is the first electrically conductive contact 30. Electrons e-migrate to the negative terminal of the paint solar cell 20, which in this case is the second electrically conductive contact 32. The resulting voltage and current are available to power external loads.

FIGS. 1 and 2 illustrate one embodiment of the paint solar cell 20. The same principles may be used in other embodiments of the paint solar cell 20, some of which are illustrated in the following FIGS. 3–11. The prior description of the embodiment of FIGS. 1–2 is incorporated into the following description of the other illustrated embodiments, to the extent applicable. The following discussion will emphasize the differences of the respective embodiments with that of FIGS. 1–2. The features of the embodiments of FIGS. 1–11 may be used together in any operable combination. FIGS. 1–11 are not drawn to scale.

In the embodiment of FIG. 3, the positions of the first paint layer structure 24 and the second paint layer structure 26 are reversed, so that the incident light 34 is first incident upon the second paint layer structure 26.

It is not necessary that both the p-type layer and the n-type layer are paints, and only one of these layers need be a paint in some embodiments. In the embodiment of FIG. 4, the first paint layer structure 24 is deposited upon a layer of a conventional semiconductor material 60. For example, the first paint layer structure may include p-type pigment particles, and the second layer of the conventional semiconductor material 60 is a non-paint n-type semiconductor such as n-type silicon or n-type germanium. Alternatively, the first paint layer structure may include n-type pigment particles, and the second layer of the conventional semiconductor material 60 is a non-paint p-type semiconductor such as p-type silicon or p-type germanium.

In the embodiment of FIG. 5, a support 62 is provided. In this case, the support 62 is a transparent sheet of polyimide or PET (polyethylene terepthalate polyester). The active components of the solar cell are mechanically supported on the support 62. Because the active components of the solar cell are typically thin layers, in most practical embodiments the active components (i.e., p-type layer and n-type layer)

and the electrically conductive contacts are supported on such a support.

Further in the embodiment of FIG. 5, the n-type semiconductor layer is provided as the semiconductor layer 60, in this case a layer of n-type indium tin oxide (ITO). ITO is sufficiently electrically conductive that it serves as both the n-type semiconductor layer and as the second electrically conductive contact. The first paint layer structure 24 with p-type pigment particles is applied to the ITO semiconductor layer 60, and the first electrically conductive contacts 30 are deposited on the first paint layer structure 24 on the side remote from the ITO semiconductor layer 60 and remote from the incident light 34. In this case the first electrically conductive contact 30 may be in the form of a solid layer or sheet, or the illustrated grid.

In the embodiment of FIG. 6, the second electrically conductive contact 32 is a thin layer of conductive material, such as vapor deposited aluminum, on the support 62. The support 62 may therefore be an electrical nonconductor. The support 62 is remote from the incident light 34 and shielded by the second electrically conductive contact 32, and it therefore may be opaque or transparent. The support 62 may be freestanding. The support 62 may be so thick as to be rigid. It may be, for example, the exterior wall of a spacecraft, a building, or an automobile. The support 62 may instead be thin and flexible, such as a 0.0005 to 0.003 inch thick sheet of polyimide, polyethylene terepthalate polyester, or the like. In either case, the support is inert and does not produce electrical voltage or current, or act as an electrical contact. The active structure 21 is deposited on the support 62, so that the active structure 21 need not be self supporting. The otherwise relatively heavy and stiff portion of the active structure 21, the second electrically conductive contact 32, may be made quite thin, light, and flexible. Thus, for example, the paint solar cell 20 may be applied to a solar sail, which serves as the support 62, that is rolled or folded for launch, opened in orbit, and connected to provide power.

The embodiment of FIG. 7 is like that of FIG. 6, except that the support 62 is curved and not flat as in FIG. 6. The paint solar cell 20 may be deposited on flat supports 62 or curved supports 62, or even flexible flat or flexible curved supports 62.

In the embodiment of FIG. 8, the second electrically conductive contact 32 is a hollow rod or tube of any shape, which serves as both the second electrically conductive contact 32 and as the support. The layers 24 and 26 are deposited upon and supported upon this second electrically conductive contact 32, and the first electrically conductive contact 30 is deposited upon the first paint layer structure 24. As demonstrated in this and other embodiments, one of the electrically conductive contacts may also serve as the support structure.

In the embodiment of FIG. 9, the second electrically conductive contact 32 is a screen, typically with a wide mesh (i.e., large open spaces between the screen wires). The second paint layer structure 26 having n-type pigment particles is applied to the second electrically conductive contact 32, as by dipping, rolling, spraying, or the like. The first paint layer structure 24 is applied over the second paint layer structure 26. The first electrically conductive contact 30 is in this case a layer of an electrically conductive paint, such as colloidal silver particles in a fluoroelastomer resin binder, that is applied to the back side of the solar cell remote from the incident light 34. External electrical contact is made to the screen wires as the second electrically conductive contact 32 and to the conductive paint 30 as the first electrically conductive contact. In this embodiment, the screen mesh supports the solar cell and also serves as one of its external electrical contacts.

The support approaches of FIGS. 6–9 may be used with any of the other paint solar cell embodiments discussed herein.

The use of paint technology for the solar cell offers other opportunities for improved performance in the form of a capacitor that is used to store some or all of the charge generated by the solar cell. In conventional practice, some of the charge generated by the solar cell is stored in batteries for those times when the solar cell is not producing power, such as when the solar cell is in eclipse. In the embodiments to be discussed next, a capacitive paint layer structure is used to store some or all of the charge generated for later use.

Figure 10:
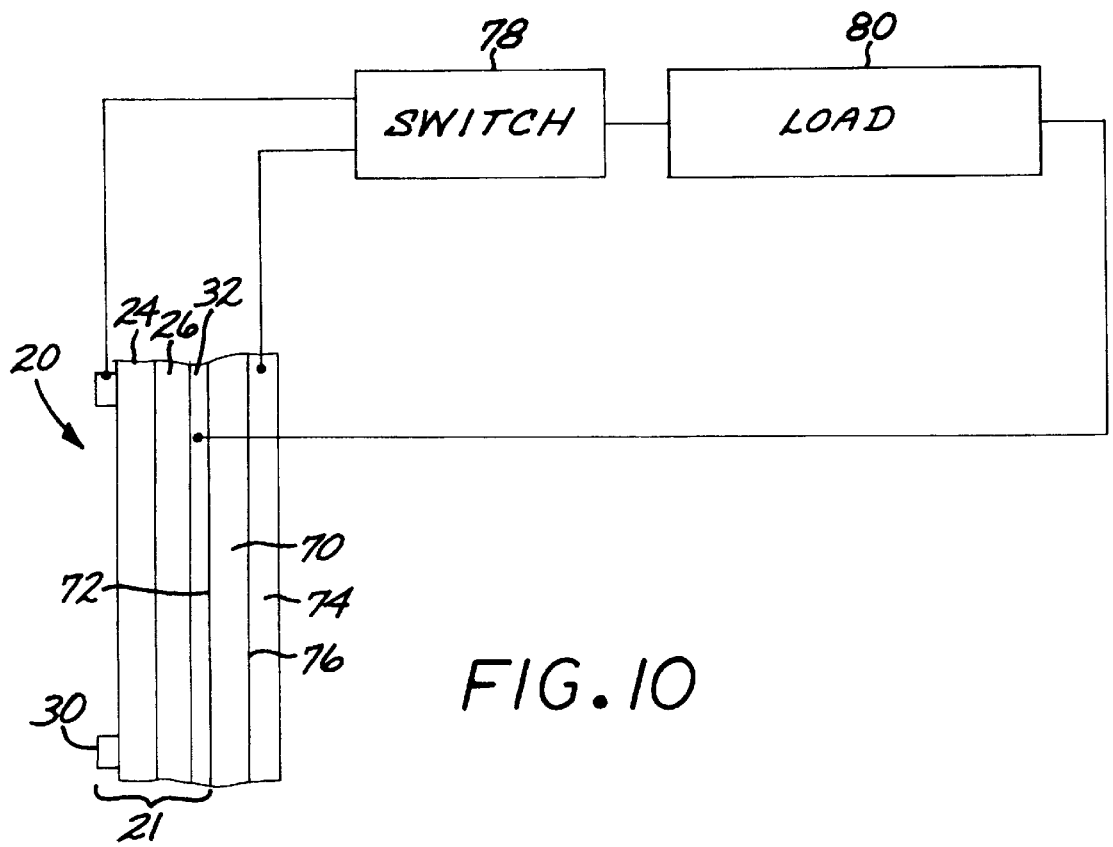
FIG. 10 is a schematic view of a paint solar cell including a capacitive paint layer structure and circuit.

The embodiment of FIG. 10 utilizes the basic structure of FIG. 1 for the active structure 21 of the solar cell, and that discussion is incorporated here. However, the capacitive storage approach may be used with any compatible embodiments of the active structure of the paint solar cell. A capacitive paint layer structure 70 comprising pyroelectric/ ferroelectric pigment particles dispersed in a capacitive layer binder is applied so that a first side 72 of the capacitive paint layer structure 70 contacts the second electrically conductive contact 32. A capacitor electrically conductive contact 74 is in electrical communication with a second side 76 of the capacitive paint layer structure 70 remote from the first side 72. As electrical energy is produced by the active structure 21, some is used externally and some is stored in the capacitive paint layer structure 70 for subsequent use. Externally to the paint solar cell 20, a switch 78 has as its output one of two switchable inputs that are in electrical communication with the first electrically conductive contact 30 and with the capacitor electrically conductive contact 74. A load 80 is connected in series with the output of the switch 78 and the second electrically conductive contact 32. When the switch 78 is operated to select as its input the first electrically conductive contact 30, the load 80 is powered from the direct output of the active structure 21 of the solar cell 20, and any excess electrical energy charges the capacitive paint layer structure 70. When the switch 78 is operated to select as its input the capacitor electrically conductive contact 74, the load 80 is powered by the energy that is discharged from the capacitive paint layer structure 70. The energy storage of the capacitive paint layer structure 70 may be selected to be sufficient to provide all of the power for the load 80 when the active structure 21 cannot produce power (i.e., during periods of eclipse). Alternatively, batteries may also be provided to supply some of the power to the load 80 when the active structure 21 cannot produce power.

Figure 11:
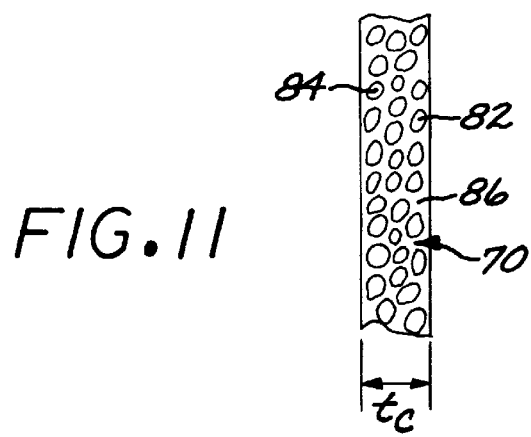
FIG. 11 is an enlarged schematic view of the capacitive paint layer structure.

As seen in FIG. 11, the capacitive paint layer structure 70 includes a plurality of pyroelectric/ferroelectric pigment particles 82 made of either a pyroelectric material, a ferroelectric material, or both. Mixtures of different compositions of pyroelectric/ferroelectric pigment particles may also be used as the pigment particles 82. The use of mixtures of different types of pyroelectric/ferroelectric pigment particles 82 allows the capacitive performance of the capacitive paint layer structure 70 to be tuned to its specific requirements. The pyroelectric/ferroelectric pigment particles 82 may be of any operable morphology and size, but typically are generally equiaxed particles from about 0.1 to about 10 micrometers in dimension.

The nature of the pyroelectric/ferroelectric pigment particles 82 may be understood by reference to their crystallographic structures. All crystals may be placed into one of 32 symmetry point groups as presently known by crystallographers. These 32 point groups are subdivisions of the well-known seven basic crystal systems: cubic, hexagonal, rhombohedral, tetragonal, orthorhombic, monoclinic, and triclinic. Twenty-one of the 32 groups are noncentrosymmetric, in that the point group lacks a center of symmetry. A lack of a center of symmetry is necessary for the crystal to exhibit the phenomenon of piezoelectricity, whereby a homogeneous stress upon the crystal produces a net movement of positive and negative ions with respect to each other, resulting in an electric dipole moment and thus polarization. Twenty of these 21 noncentrosymmetric point groups exhibit piezoelectricity. Of the 20 point groups which exhibit piezoelectricity, 10 are known to be pyroelectric (sometimes called polar). A pyroelectric crystal has the additional characteristic of becoming spontaneously polarized and forming permanent dipole moments within a given temperature range. Non-ferroelectric pigment materials which lie within the 10 pyroelectric point groups are operable with this invention, but are not preferred because their polarization effects are relatively small. The 10 pyroelectric (or polar) point groups are (in Schoenflies notation): $C_1$, $C_2$, $C_5$ or $C_{1h}$, $C_{2v}$, $C_4$, $D_4$, $C_3$, $C_{3v}$, $C_6$, and $C_{6v}$. An included (noncentrosymmetric point group) material class is the antiferroelectrics, which are polar at the level of the crystallographic unit cell but do not have an apparent macroscopic polarization.

A special subgroup of the 10 pyroelectric point groups is known as ferroelectrics, which, with the appropriate doping, are the preferred materials for use as the pigment in the present invention. The ferroelectric material is distinguishable from the pyroelectric material in that the polarization is reversible by an electrical field of magnitude of less than the dielectric breakdown strength of the crystal itself, a condition which is not present in a material designated as exhibiting pyroelectricity alone. The preferred ferroelectric materials are thus characterized by both a spontaneous polarization resulting in permanent dipoles within a given temperature range and the characteristic of the ability to reorient the polarization by an externally applied electric field.

The pigment particles 82 are therefore described as "pyroelectric/ferroelectric", a term of art used herein to mean that they are a pyroelectric material but are preferably within the subgroup of the ferroelectric materials. Because the ferroelectric materials represent the preferred embodiment, the following discussion will focus on ferroelectric materials with the understanding that materials which are pyroelectric but not ferroelectric may also be used.

There are many ferroelectric crystals and ceramic solid solutions which are operable within the scope of this invention. Of the ferroelectric subgroup of the 10 pyroelectric point groups, several are of particular importance. These include the tungsten bronze structure (for example, $PbNb_2O_6$), the oxygen octahedral structure (generalized by example $ABO_3$), the pyrochlore structure (for example, $Cd_2Nb_2O_7$), and layer structures (for example, $Bi_4Ti_3O_{12}$). Of further importance within the oxygen octahedral structures are the ceramic perovskites which are of particular importance to this invention. The perovskites include, by way of example, barium titanate $BaTiO_3$ along with its various solid solutions such as BST (barium strontium titanates), PZT (lead zirconate titanates), PLZT (lead lanthanum zirconate titanates), PT (lead titanates), PMN (lead magnesium niobates), and sodium-potassium niobates (Na, K)$NbO_3$. Other operable ferroelectrics include PZN (lead zinc niobates), PSZT (lead stannate zirconate titanates), PZ (lead zirconates), and SBT (strontium bismuth titanates). Many other ferroelectric materials are known and may be used in relation to the present invention. Examples include $BaTiO_3$ mixed with $MgSnO_3$, $SrTiO_3$ mixed with $CaTiO_3$, $CaSnO_3$ mixed with CaO, $CaZrO_3$, $CaSnO_3$, and $Bi_2(SnO_3)_3$. Relaxor ferroelectric material systems such as $Pb(Mg_{1/3}Nb_{2/3})O_3$—$PbTiO_3$—$Ba(Zn_{1/3}Nb_{2/3})O_3$ are additional examples of operable ferroelectrics. These materials are given only by way of example to define the scope of the operable materials using the crystal structure, and the invention is not limited to these materials.

Filler particles 84 may also be present. The filler particles 84 enter into the capacitive storage process only weakly, if at all. Instead, their main function is to add bulk and flow consistency, as well as other physical properties, to the capacitive paint layer structure 70. Examples of operable filler particles 84 include $SiO_2$ and $Al_2O_3$. The filler particles 84 may be of any operable morphology and size, but typically are generally equiaxed particles from about 0.1 to about 10 micrometers in dimension.

The capacitive paint layer structure 70 further includes a binder 86. The binder 86 serves as a matrix in which the particles 40 and 84 are embedded and dispersed, and thence as an insulating medium. The binder 86 also serves to adhere the capacitive paint layer structure 70 to other layers or structure. The binder 86 may be an organic binder or an inorganic binder. Examples of operable organic binders include cross-linked and polymerized dimethyl silicone copolymer, silicone-modified epoxy, polyurethane, poly (dimethyl-siloxane), poly(dimethylsiloxane-co-methylphenylsiloxane), polyimide, polyamide, and fluoroelastomers (e.g., poly[tetrafluoroethylene-co-vinylidene fluoride-co-propylene]). An example of an operable inorganic binders is potassium silicate.

The pyroelectric/ferroelectric pigment particles 82 are preferably present in an amount of from about 50 to about 80 percent by volume of the capacitive paint layer structure 70.

The capacitive paint layer structure 70 may be of any operable thickness $t_c$, but is typically from about 0.0005 to about 0.0015 inch thickness. The capacitor may be multilayered as well.

FIG. 12 depicts a preferred approach for practicing the invention, although other approaches may be used that produce other operable configurations of the solar cell. A liquid first paint is prepared, numeral 200, and a liquid second paint is prepared, numeral 202. The procedures to prepare the liquid paints are like those discussed in U.S. Pat. Nos. 6,099,637 and 6,124,378, whose disclosures are incorporated by reference in their entireties, except that the constituents discussed herein are used.

The solar cell is fabricated, numeral 204, using the liquid paints. Within this step 204, the first paint layer structure 24 is applied and dried, numeral 206; the second paint layer structure 26 is applied and dried, numeral 208; and the electrical contacts 30 and 32 are formed, numeral 210. The sequencing of these steps 206, 208, and 210 varies according to the embodiment of the invention that is to be practiced. In some cases, for example, the paint layer structures 24 and 26 are applied to the second electrically conductive contact 32; in other cases a thin layer of the second electrically conductive contact 32 is applied to the support 62 and the paint layer structures 24 and 26 are applied over the second electrically conductive contact 32. Many other combinations and sequences are possible, depending upon the embodiment. The common feature of all of these processes is that the paint layer structures are first provided as liquid paints, applied, and dried.

In performing the steps 206 and 208, it is preferred that the first-applied paint layer structure is only partially dried, not fully dried, when the second-applied paint layer structure is applied. The application of the second-applied paint layer structure to a somewhat tacky first-applied paint layer structure promotes good bonding and a low electrical resistance between the two paint layers. If the second-applied paint layer structure is applied to a completely dried first-applied paint layer structure, there is a greater likelihood of mechanical disbanding of the two paint layer structures.

The result is a paint solar cell that does not have the capacitive storage feature. This feature may be added to the basic paint solar cell if desired, numeral 212. To do so, the liquid capacitive paint is prepared, numeral 214, by the approach referenced above. The capacitive paint layer structure 70 is applied and dried, numeral 216, and the capacitive electrically conductive contact 74 is formed, numeral 218.

In a variation of the approach of FIG. 12, only one of the layers is a paint and the other is another type of structure such as a conventional semiconductor material. The paint layer is applied to the conventional layer and dried. The electrical contacts are provided.

The present invention has been reduced to practice and found operable. A paint solar cell was prepared by applying a second paint layer structure 26 of n-ZnO particles in a silicone polymer resin onto a second electrically conductive contact 32 in the form of a 0.032 inch thick sheet of 6061-T6 aluminum. After the second paint layer structure 26 was partially dry, a first paint layer structure 24 of p-type $Cu_2S$ pigment particles in a silicone polymer resin was applied over the second paint layer structure 26 and dried. The application and drying steps were conducted in air at room temperature. Stripes of colloidal silver in a fluoroelastomer resin were applied over the first paint layer structure 24 and dried, forming the first electrically conductive contacts 30. The result was a solar cell like that of FIG. 1. When a light was directed toward the first paint layer side of the resulting structure, a voltage resulted between the contacts 30 and 32 and a current flow was observed.

A second paint solar cell structure like that described above was prepared, but additionally a capacitive paint layer structure 70 of $BaTiO_3$ particles in a silicone binder was prepared and applied to the exposed side of the second electrically conductive contact 32 remote from the second paint layer structure 26, and partially dried. A capacitor electrically conductive contact 74 was painted onto the exposed side of the capacitive paint layer structure 70 remote from the second electrically conductive contact 32, with the same material used to form the first electrically conductive contacts 30. The structure was dried, resulting in a solar cell like that of FIG. 10. When a light was directed toward the first paint layer side of the resulting structure, a voltage resulted between the contacts 30 and 32 and a current flow was observed. After the light was turned off, a slowly decreasing output voltage was observed and a current flow was measured, indicating that there had been energy storage in the capacitive paint layer structure 70.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell comprising an active structure including:

a voltage source having a p-type semiconductor layer structure and an n-type semiconductor layer structure in electrical contact with each other, at least one of the semiconductor layer structures being a paint layer structure comprising first-layer paint pigment particles dispersed in a first-layer binder, wherein the paint layer structure has a thickness of from about 0.0005 to about 0.0015 inch, and wherein the first-layer paint pigment particles are selected from the group consisting of p-type pigment particles and n-type pigment particles; and an electrically conductive contact structure having
a first electrically conductive contact to a first one of the semiconductor layer structures, and
a second electrically conductive contact to a second one of the semiconductor layer structures, at least one of the first electrically conductive contact and the second electrically conductive contact permitting light to pass therethrough to the voltage source.

2. The solar cell of claim 1, wherein the voltage source comprises
a first paint layer structure comprising p-type pigment particles dispersed in the first-layer binder, and
a second paint layer structure comprising n-type pigment particles dispersed in a second-layer binder.

3. The solar cell of claim 1, wherein the voltage source comprises
a first paint layer structure comprising p-type pigment particles dispersed in the first-layer binder, and
a second structure comprising an n-type semiconductor.

4. The solar cell of claim 1, wherein the voltage source comprises
a first paint layer structure comprising n-type pigment particles dispersed in the first-layer binder, and
a second paint layer structure comprising a p-type semiconductor.

5. The solar cell of claim 1, further including
a support to which the active structure is attached.

6. The solar cell of claim 1, wherein the first electrically conductive contact permits light to pass therethrough, and further including
a capacitor in electrical communication with the second electrically conductive contact, the capacitor comprising
a capacitive paint layer structure comprising pyroelectric/ferroelectric pigment particles dispersed in a capacitive layer binder, a first side of the capacitive paint layer structure contacting the second electrically conductive contact, and
a capacitor electrically conductive contact in electrical communication with a second side of the capacitive paint layer structure remote from the first side.

7. The solar cell of claim 2, wherein the first paint layer structure and the second paint layer structure are in direct physical contact with each other.

8. A solar cell comprising an active structure including:
a paint voltage source having
a first paint layer structure comprising p-type pigment particles dispersed in a first-layer binder, wherein the first paint layer structure has a thickness of from about 0.0005 to about 0.0015 inch, and a second paint layer structure comprising n-type pigment particles dispersed in a second-layer binder, the second paint layer structure being in electrical contact with the first paint layer structure, wherein the second paint layer structure has a thickness of from about 0.0005 to about 0.0015 inch; and an electrically conductive contact structure having
a first electrically conductive contact to the first paint layer structure, and
a second electrically conductive contact to the second paint layer structure, at least one of the first electrically conductive contact and the second electrically conductive contact permitting light to pass therethrough to the paint voltage source.

9. The solar cell of claim 8, further including
a support to which the active structure is attached.

10. The solar cell of claim 9, wherein the support is flexible.

11. The solar cell of claim 9, wherein the support is flat.

12. The solar cell of claim 9, wherein the support is curved.

13. The solar cell of claim 8, wherein at least one of the first-layer binder and the second-layer binder is an organic material.

14. The solar cell of claim 8, wherein at least one of the first-layer binder and the second-layer binder is an inorganic material.

15. The solar cell of claim 8, wherein at least one of the first paint layer structure and the second paint layer structure comprises a filler particle.

16. The solar cell of claim 8, wherein the first electrically conductive contact permits light to pass therethrough, and further including
a capacitor in electrical communication with the second electrically conductive contact.

17. The solar cell of claim 8, wherein the first electrically conductive contact permits light to pass therethrough, and further including
a capacitor in electrical communication with the second electrically conductive contact, the capacitor comprising
a capacitive paint layer structure comprising pyroelectric/ferroelectric pigment particles dispersed in a capacitive layer binder, a first side of the capacitive paint layer structure contacting the second electrically conductive contact, and
a capacitor electrically conductive contact in electrical communication with a second side of the capacitive paint layer structure remote from the first side of the capacitive paint layer structure.

18. The solar cell of claim 8, wherein the second electrically conductive contact permits light to pass therethrough, and further including
a capacitor in electrical communication with the first electrically conductive contact, the capacitor comprising
a capacitive paint layer structure comprising pyroelectric/ferroelectric pigment particles dispersed in a capacitive layer binder, a first side of the capacitive paint layer structure contacting the first electrically conductive contact, and
a capacitor electrically conductive contact in electrical communication with a second side of the capacitive paint layer structure remote from the first side of the capacitive paint layer structure.

19. The solar cell of claim 8, wherein
the first electrically conductive contact contacts the first paint layer structure and allows light to pass therethrough, and
the first paint layer structure is black in color.

20. The solar cell of claim 8, wherein the first paint layer structure and the second paint layer structure are in direct physical contact with each other.

21. A method for preparing a solar cell, comprising the steps of
preparing a liquid first paint comprising p-type pigment particles, a first-paint binder, and a first paint liquid vehicle;
preparing a liquid second paint comprising n-type pigment particles, a second-paint binder, and a second paint liquid vehicle; and
fabricating the solar cell by
applying a first layer of the liquid first paint and at least partially drying the liquid first paint by removing the first paint liquid vehicle, to leave a solid first paint layer structure comprising the p-type pigment particles and the first-paint binder, wherein the first paint layer structure has a thickness of from about 0.0005 to about 0.0015 inch,
applying a second layer of the liquid second paint and drying the liquid second paint by removing the second paint liquid vehicle, to leave a solid second paint layer structure comprising the n-type pigment particles and the second-paint binder, the second layer being in facing contact with the first layer, wherein the second paint layer structure has a thickness of from about 0.0005 to about 0.0015 inch, and
forming a first electrically conductive contact to the solid first paint layer structure and a second electrically conductive contact to the solid second paint layer structure, at least one of the first electrically conductive contact and the second electrically conductive contact permitting light to pass therethrough.

22. The method of claim 21, wherein the step of preparing a liquid first paint includes the step of
milling the p-type pigment particles, and
wherein the step of preparing a liquid second paint includes the step of
milling the n-type pigment particles.

23. A solar cell comprising an active structure including:
a voltage source having a p-type semiconductor layer structure and an n-type semiconductor layer structure in electrical contact with each other, at least one of the semiconductor layer structures being a paint layer structure comprising first-layer paint pigment particles dispersed in a first-layer binder, the first-layer paint pigment particles being selected from the group consisting of p-type pigment particles and n-type pigment particles;
an electrically conductive contact structure having
a first electrically conductive contact to a first one of the semiconductor layer structures, wherein the first electrically conductive contact permits light to pass therethrough, and
a second electrically conductive contact to a second one of the semiconductor layer structures, at least one of the first electrically conductive contact and the second electrically conductive contact permitting light to pass therethrough to the voltage source; and
a capacitor in electrical communication with the second electrically conductive contact, the capacitor comprising a capacitive paint layer structure comprising pyroelectric/ferroelectric pigment particles dispersed in a capacitive layer binder, a first side of the capacitive paint layer structure contacting the second electrically conductive contact, and a capacitor electrically conductive contact in electrical communication with a second side of the capacitive paint layer structure remote from the first side.

24. A solar cell comprising an active structure including:

a paint voltage source having
  a first paint layer structure comprising p-type pigment particles dispersed in a first-layer binder, and
  a second paint layer structure comprising n-type pigment particles dispersed in a second-layer binder, the second paint layer structure being in electrical contact with the first paint layer structure, wherein at least one of the first paint layer structure and the second paint layer structure comprises a filler particle; and an electrically conductive contact structure having
  a first electrically conductive contact to the first paint layer structure, and
  a second electrically conductive contact to the second paint layer structure, at least one of the first electrically conductive contact and the second electrically conductive contact permitting light to pass therethrough to the paint voltage source.

25. A solar cell comprising an active structure including:

a paint voltage source having
  a first paint layer structure comprising p-type pigment particles dispersed in a first-layer binder, and
  a second paint layer structure comprising n-type pigment particles dispersed in a second-layer binder, the second paint layer structure being in electrical contact with the first paint layer structure;

an electrically conductive contact structure having
  a first electrically conductive contact to the first paint layer structure, wherein the first electrically conductive contact permits light to pass therethrough, and
  a second electrically conductive contact to the second paint layer structure, at least one of the first electrically conductive contact and the second electrically conductive contact permitting light to pass therethrough to the paint voltage source; and a capacitor in electrical communication with the second electrically conductive contact, the capacitor comprising
  a capacitive paint layer structure comprising pyroelectric/ferroelectric pigment particles dispersed in a capacitive layer binder, a first side of the capacitive paint layer structure contacting the second electrically conductive contact, and
  a capacitor electrically conductive contact in electrical communication with a second side of the capacitive paint layer structure remote from the first side of the capacitive paint layer structure.

26. A solar cell comprising an active structure including:

a paint voltage source having
  a first paint layer structure comprising p-type pigment particles dispersed in a first-layer binder, and
  a second paint layer structure comprising n-type pigment particles dispersed in a second-layer binder, the second paint layer structure being in electrical contact with the first paint layer structure;

an electrically conductive contact structure having
  a first electrically conductive contact to the first paint layer structure, and
  a second electrically conductive contact to the second paint layer structure, at least one of the first electrically conductive contact and the second electrically conductive contact permitting light to pass therethrough to the paint voltage source, wherein the second electrically conductive contact permits light to pass therethrough; and a capacitor in electrical communication with the first electrically conductive contact, the capacitor comprising
  a capacitive paint layer structure comprising pyroelectric/ferroelectric pigment particles dispersed in a capacitive layer binder, a first side of the capacitive paint layer structure contacting the first electrically conductive contact, and
  a capacitor electrically conductive contact in electrical communication with a second side of the capacitive paint layer structure remote from the first side of the capacitive paint layer structure.

* * * * *